(12) United States Patent
Lin et al.

(10) Patent No.: US 11,605,777 B2
(45) Date of Patent: Mar. 14, 2023

(54) MRAM STRUCTURE AND METHOD OF FABRICATING THE SAME

(71) Applicant: UNITED MICROELECTRONICS CORP., Hsin-Chu (TW)

(72) Inventors: Da-Jun Lin, Kaohsiung (TW); Min-Hua Tsai, Tainan (TW); Tai-Cheng Hou, Tainan (TW); Fu-Yu Tsai, Tainan (TW); Bin-Siang Tsai, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 138 days.

(21) Appl. No.: 17/006,923

(22) Filed: Aug. 31, 2020

(65) Prior Publication Data
US 2022/0045266 A1 Feb. 10, 2022

(30) Foreign Application Priority Data

Aug. 5, 2020 (CN) .......................... 202010776346.6

(51) Int. Cl.
*H01L 43/02* (2006.01)
*H01L 43/12* (2006.01)
*H01L 27/22* (2006.01)

(52) U.S. Cl.
CPC ............ *H01L 43/02* (2013.01); *H01L 27/222* (2013.01); *H01L 43/12* (2013.01)

(58) Field of Classification Search
CPC .............................. H01L 43/02; H01L 27/222
See application file for complete search history.

(56) References Cited

U.S. PATENT DOCUMENTS

| | | | |
|---|---|---|---|
| 2006/0269692 A1* | 11/2006 | Balseanu | ............ H01L 21/0217 427/532 |
| 2012/0217594 A1 | 8/2012 | Kajiyama | |
| 2016/0111325 A1* | 4/2016 | JangJian | ........... H01L 21/76807 257/774 |
| 2019/0165258 A1* | 5/2019 | Peng | ..................... G11C 11/161 |
| 2019/0189502 A1 | 6/2019 | Kim | |
| 2020/0136028 A1* | 4/2020 | Lanzillo | .................. H01L 43/12 |

(Continued)

OTHER PUBLICATIONS

M. Löhndorf et al., Characterization of magnetic tunnel junctions (MTJ) with magnetostrictive free layer materials, Journal of Magnetism and Magnetic Materials 272-276 (2004) 2023-2024 (Year: 2004).*

(Continued)

*Primary Examiner* — Shih Tsun A Chou
(74) *Attorney, Agent, or Firm* — Winston Hsu

(57) ABSTRACT

An MRAM structure includes a dielectric layer. A first MRAM, a second MRAM and a third MRAM are disposed on the dielectric layer, wherein the second MRAM is disposed between the first MRAM and the third MRAM, and the second MRAM includes an MTJ. Two gaps are respectively disposed between the first MRAM and the second MRAM and between the second MRAM and the third MRAM. Two tensile stress pieces are respectively disposed in each of the two gaps. A first compressive stress layer surrounds and contacts the sidewall of the MTJ entirely. A second compressive stress layer covers the openings of each of the gaps and contacts the two tensile stress pieces.

18 Claims, 10 Drawing Sheets

(56) References Cited

U.S. PATENT DOCUMENTS

2021/0104576 A1* 4/2021 Lee ...................... H01L 27/224

OTHER PUBLICATIONS

K. D. Mackenzie et al., Stress Control of Si-Based PECVD Dielectrics, Proc. Symp. Silicon Nitride and Silicon Dioxide Thin Insulating Films & Other Emerging Dielectrics VIII, PV2005-0I, 148-159, Electrochemical Society, Pennington, NJ (2005) (Year: 2005).*
K. Fujino et al 1990 J. Electrochem. Soc. 137 2883 (Year: 1990).*

* cited by examiner

US 11,605,777 B2

MRAM STRUCTURE AND METHOD OF FABRICATING THE SAME

BACKGROUND OF THE INVENTION

1. Field of the Invention

The present invention relates to a magnetic random access memory (MRAM) structure and a method of fabricating the same, and more particularly to an MRAM without an MTJ deformation and a method of fabricating the same.

2. Description of the Prior Art

Many modern day electronic devices contain electronic memory configured to store data. Electronic memory may be volatile memory or non-volatile memory. Volatile memory stores data only while it is powered, while non-volatile memory is able to store data when power is removed. MRAM is one promising candidate for next generation non-volatile memory technology. An MRAM cell includes a magnetic tunnel junction (MTJ) having a variable resistance, located between two electrodes disposed within back-end-of-the-line (BEOL) metallization layers.

An MTJ generally includes a layered structure comprising a reference layer, a free layer and a dielectric barrier in between. The reference layer of magnetic material has a magnetic vector that always points in the same direction. The magnetic vector of the free layer is free, but is determined by the physical dimensions of the element. The magnetic vector of the free layer points in either of two directions: parallel or anti-parallel with the magnetization direction of the reference layer.

Conventional MRAMs have some disadvantages, for example, the deformation of the MTJ because of the stress within the material layer around the MTJ. Therefore an improved MRAM structure is required in the field.

SUMMARY OF THE INVENTION

According to a first preferred embodiment of the present invention, an MRAM structure includes a dielectric layer. A first MRAM, a second MRAM and a third MRAM are disposed on the dielectric layer, wherein the second MRAM is disposed between the first MRAM and the third MRAM, and the second MRAM includes an MTJ. Two gaps are respectively disposed between the first MRAM and the second MRAM and between the second MRAM and the third MRAM. Two tensile stress pieces are respectively disposed in each of the two gaps. A first compressive stress layer surrounds and contacts the sidewall of the MTJ entirely. A second compressive stress layer covers the openings of each of the gaps and contacts the two tensile stress pieces.

According to another preferred embodiment of the present intention, a method of fabricating an MRAM structure includes providing a dielectric layer, wherein a first MRAM, a second MRAM and a third MRAM are disposed on the dielectric layer, the second MRAM are disposed between the first MRAM and the third MRAM, two gaps are respectively disposed between the first MRAM and the second MRAM and between the second MRAM and the third MRAM and the second MRAM comprises an MTJ. Later, a first compressive stress layer is formed to cover the first MRAM, the second MRAM, the third MRAM and the dielectric layer. Subsequently, a tensile stress material layer is formed to cover the first compressive stress layer and fill in the two gaps. Next, the tensile stress material layer outside of the two gaps is removed to form two tensile stress pieces in each of the two gaps. Finally, a second compressive stress layer is formed to cover an opening of each of the two gaps and contacting the tensile stress pieces.

According to yet another preferred embodiment of the present intention, An MRAM structure includes a dielectric layer. A plurality of MRAMs are disposed on the dielectric layer and the plurality of MRAMs are arranged in one row, wherein the plurality of MRAMs include an end MRAM disposed at an end of the row. A dummy MRAM is disposed on the dielectric layer and at one side of the end MRAM. A gap is disposed between the end MRAM and the dummy MRAM. A first compressive stress layer contacts a sidewall of the gap. A tensile stress piece is disposed within the gap. A second compressive stress layer covers an opening of the gap and contacts the tensile stress piece. A plurality of metal interconnections respectively contacting each of the plurality of MRAMs.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 depict a fabricating method of an MRAM structure according to a preferred embodiment of the present invention, wherein:

FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
and
FIG. 6 is a fabricating stage following FIG. 5.

DETAILED DESCRIPTION

Figure 7:
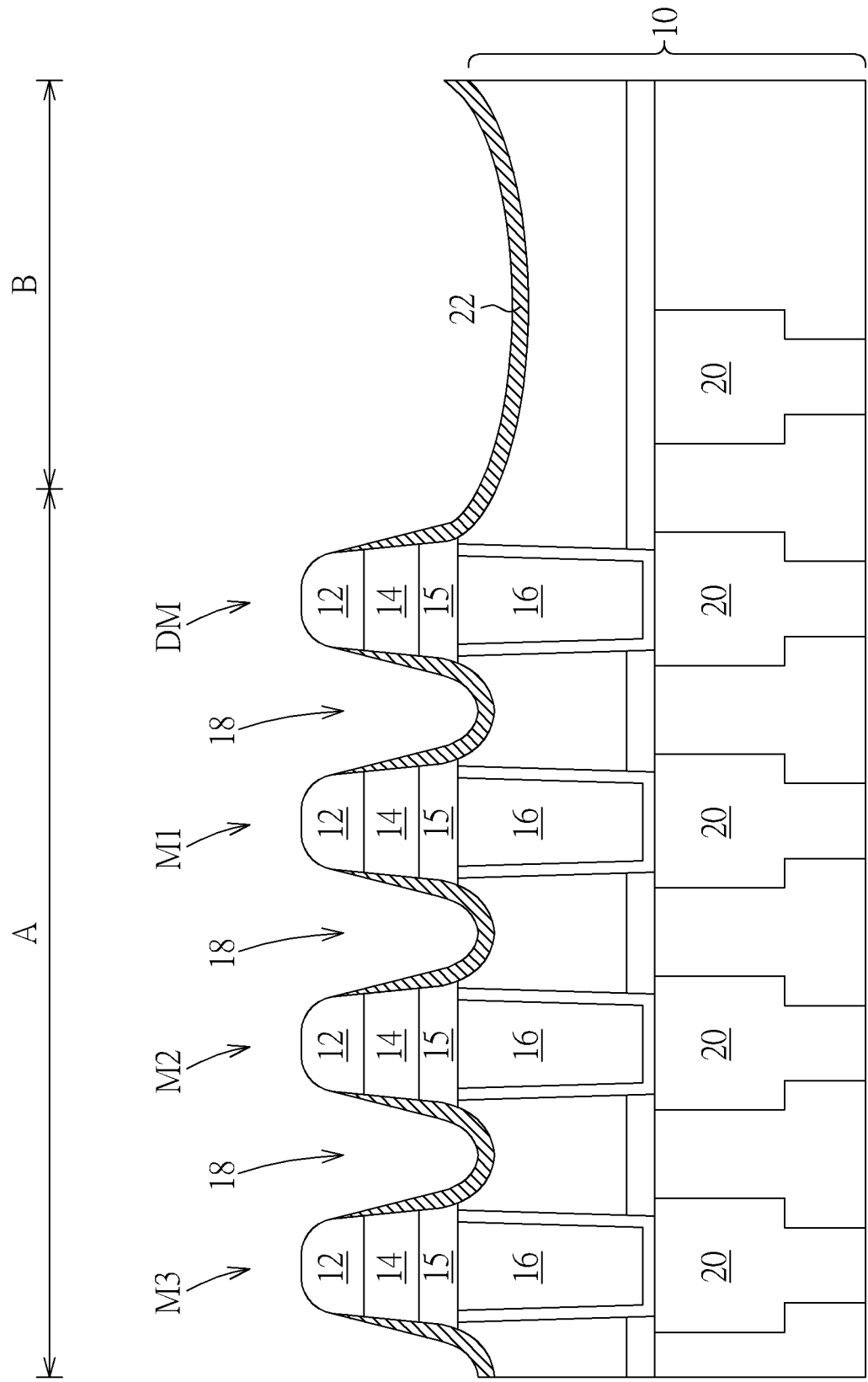
FIG. 7 depicts a fabricating stage of an etching back step according to a preferred embodiment of the present invention.
Figure 8:
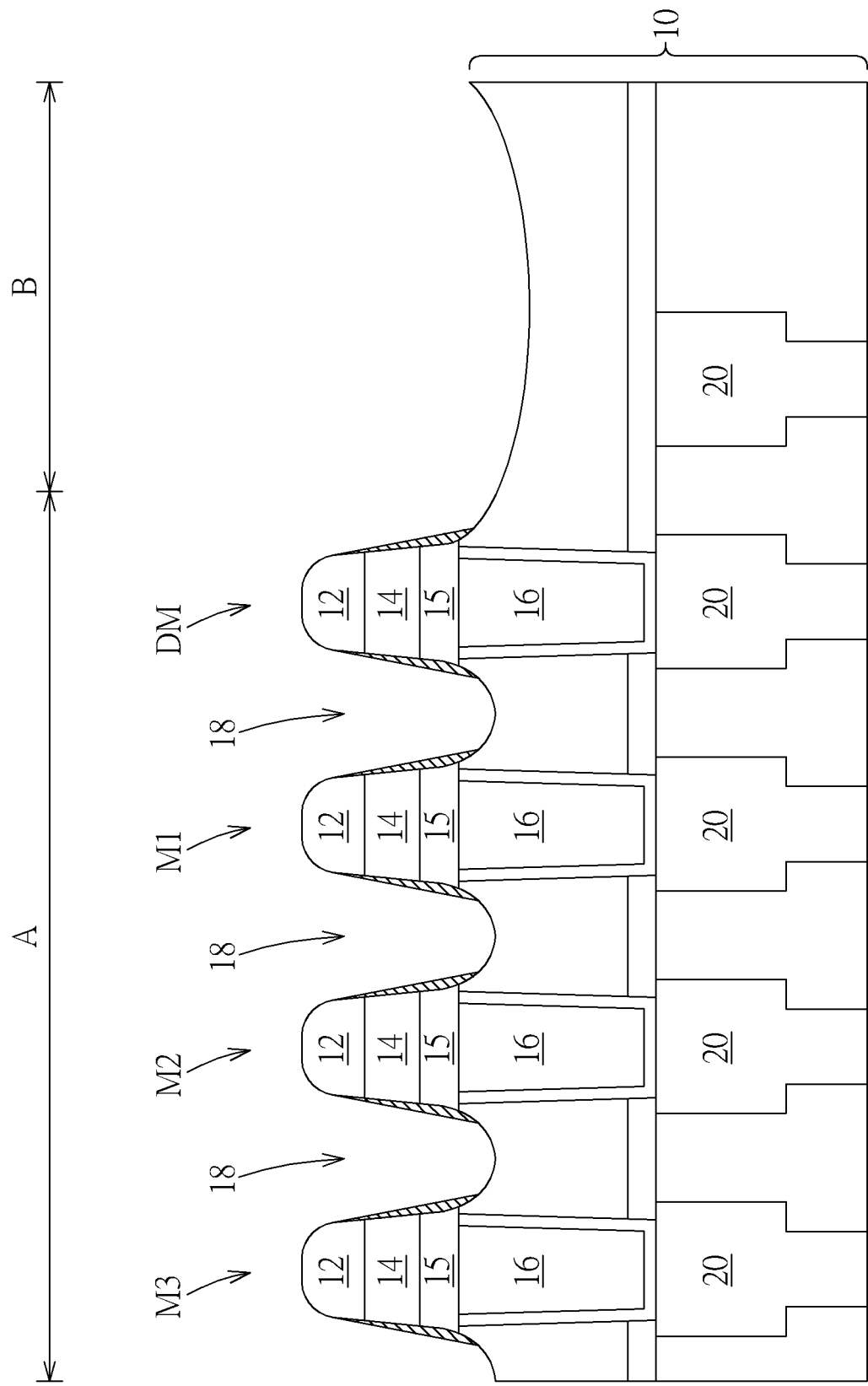
FIG. 8 depicts another fabricating stage of an etching back step according to another preferred embodiment of the present invention.

FIG. 1 to FIG. 6 depict a fabricating method of an MRAM structure according to a preferred embodiment of the present invention. FIG. 7 depicts a fabricating stage of an etching back step according to a preferred embodiment of the present invention. FIG. 8 depicts another fabricating stage of an etching back step according to another preferred embodiment of the present invention.

Figure 1:
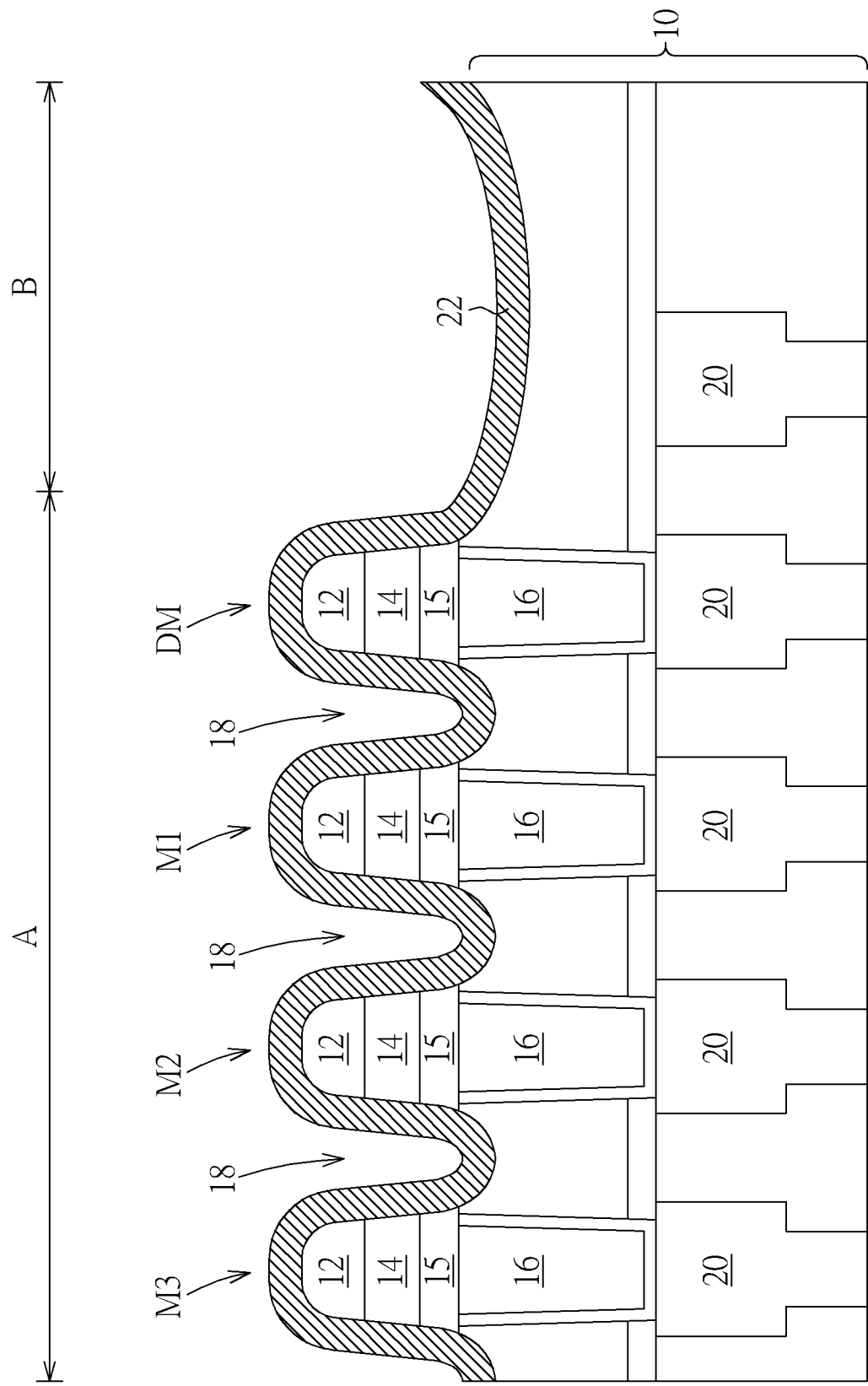

As shown in FIG. 1, a dielectric layer 10 is provided. The dielectric layer 10 is divided into a memory cell region A and a peripheral circuit region B. Numerous MRAMs are arranged in an array. For example, a first MRAM M1, a second MRAM M2 and a third MRAM M3 are disposed on the dielectric layer 10 from right to left in a row. The second MRAM M2 is disposed between the first MRAM M1 and the third MRAM M3. Moreover, the first MRAM M1 is disposed at the end of the row. Therefore, the first MRAM M1 is defined as an end MRAM in the row. Moreover, a dummy MRAM DM is disposed on the dielectric layer 10 and at one side of the first MRAM M1.

Furthermore, the first MRAM M1, the second MRAM M2, the third MRAM M3 and the dummy MRAM DM are respectively includes a top electrode 12, an MTJ 14 and a bottom electrode 15. Numerous gaps 18 are respectively disposed between two adjacent MRAMs. For example, the gap 18 can be disposed between the dummy MRAM DM and the first MRAM M1, between the first MRAM M1 and the second MRAM M2, or between the second MRAM M2 and the third MRAM M3.

Moreover, numerous metal interconnections 20 are arranged within the dielectric layer 10. The metal interconnections 20 electrically connect to the bottom electrode 15 of the first MRAM M1, the bottom electrode 15 of the second MRAM M2, the bottom electrode 15 of the third MRAM M3, and the bottom electrode 15 of the dummy MRAM DM through a bottom conductive line 16.

Next, a first compressive stress layer 22 is formed to cover the first MTJ M1, the second MRAM M2, the third MRAM M3, the dummy MRAM DM and the dielectric layer 10. The first compressive stress layer 22 contains compressive stress, therefore the first compressive stress layer 22 is smaller in porosity. In this way, the first compressive stress layer 22 can block moisture or oxygen. By forming the first compressive stress layer 22 to cover the first MTJ M1, the second MRAM M2, the third MRAM M3 and the dummy MRAM DM, the moisture or oxygen can be prevented from getting into the first MTJ M1, the second MRAM M2, the third MRAM M3 and the dummy MRAM DM. According to a preferred embodiment of the present invention, a thickness of the first compressive stress layer 22 greater than 50 angstroms is a thickness enough to block moisture or oxygen. The first compressive stress layer 22 can be silicon nitride, silicon oxide, silicon oxynitride or other insulating materials. In this embodiment, the first compressive stress layer 22 is preferably silicon nitride.

Figure 2:
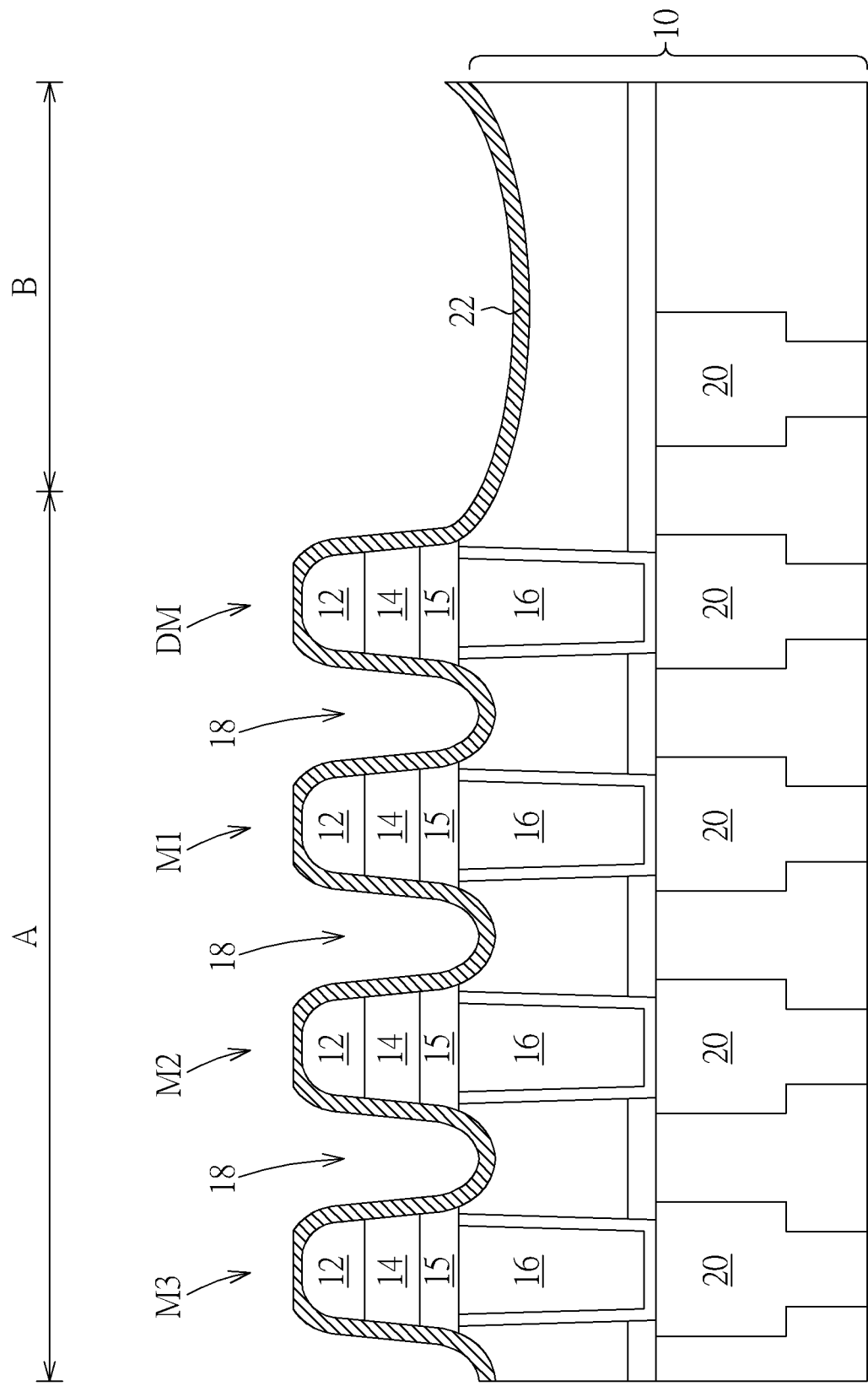

As shown in FIG. 2, the first compressive stress layer 22 is etched back to thin the first compressive stress layer 22 and to remove part of the first compressive stress layer 22. Moreover, the etching rate of the etching back can be adjusted based on different requirements. For example, in FIG. 2, the first compressive stress layer 22 still entirely covers the first MTJ M1, the second MRAM M2, the third MRAM M3 and the dummy MRAM DM after the etching back. In other words, the entire sidewall and the top surface of the first MRAM M1, the entire sidewall and the top surface of the second MRAM M2, the entire sidewall and the top surface of the third MRAM M3, and the entire sidewall and the top surface of the dummy MRAM DM are covered by the first compressive stress layer 22. Moreover, all of the gaps 18 are also entirely covered by the first compressive stress layer 22.

As shown in FIG. 7, according to another preferred embodiment of the present invention, the first compressive stress layer 22 is etched back until the top surface of the first MRAM M1, the top surface of the second MRAM M2, the top surface of the first MRAM M3 and the top surface of the dummy MRAM DM are exposed. The top surface mentioned above includes the top electrode 12 of the first MRAM M1, the top electrode 12 of the second MRAM M2, the top electrode 12 of the third MRAM M3 and the top electrode 12 of the dummy MRAM DM.

As shown in FIG. 8, according to yet another preferred embodiment of the present invention, the first compressive stress layer 22 is etched back until the top surface of the first MRAM M1, the top surface of the second MRAM M2, the top surface of the first MRAM M3, the top surface of the dummy MRAM DM and the bottoms of the gaps 18 are exposed. The etching back described in FIG. 2, FIG. 7 and FIG. 8 features in that at least the first compressive stress layer 22 surrounding and contacting the entire sidewall of the first MRAM M1, the entire sidewall of the second MRAM M2, the entire sidewall of the third MRAM M3, and the entire sidewall of the dummy MRAM DM are kept. In this way, moisture and oxygen can be prevented from entering the MTJ 14.

The free layer, the reference layer, the interlayer exchange coupling (IEC) material layer and the perpendicular magnetic anisotropic (PMA) material layer are formed by pure metal films. Because elastic modulus of the metal films are low, the free layer, the reference layer, the IEC material layer, the PMA material layer or other metal films in the sidewall of the MTJ 14 are deformed due to the contact of the first compressive stress layer 22. However, the free layer, the reference layer, the IEC material layer, the PMA material layer or other metal films at the center of the MTJ 14 are not deformed because they are not contacted by the first compressive stress layer 22. In this way, the shape of the MTJ 14 becomes asymmetric and lead to unstable performance of the MRAM structure.

Figure 3:
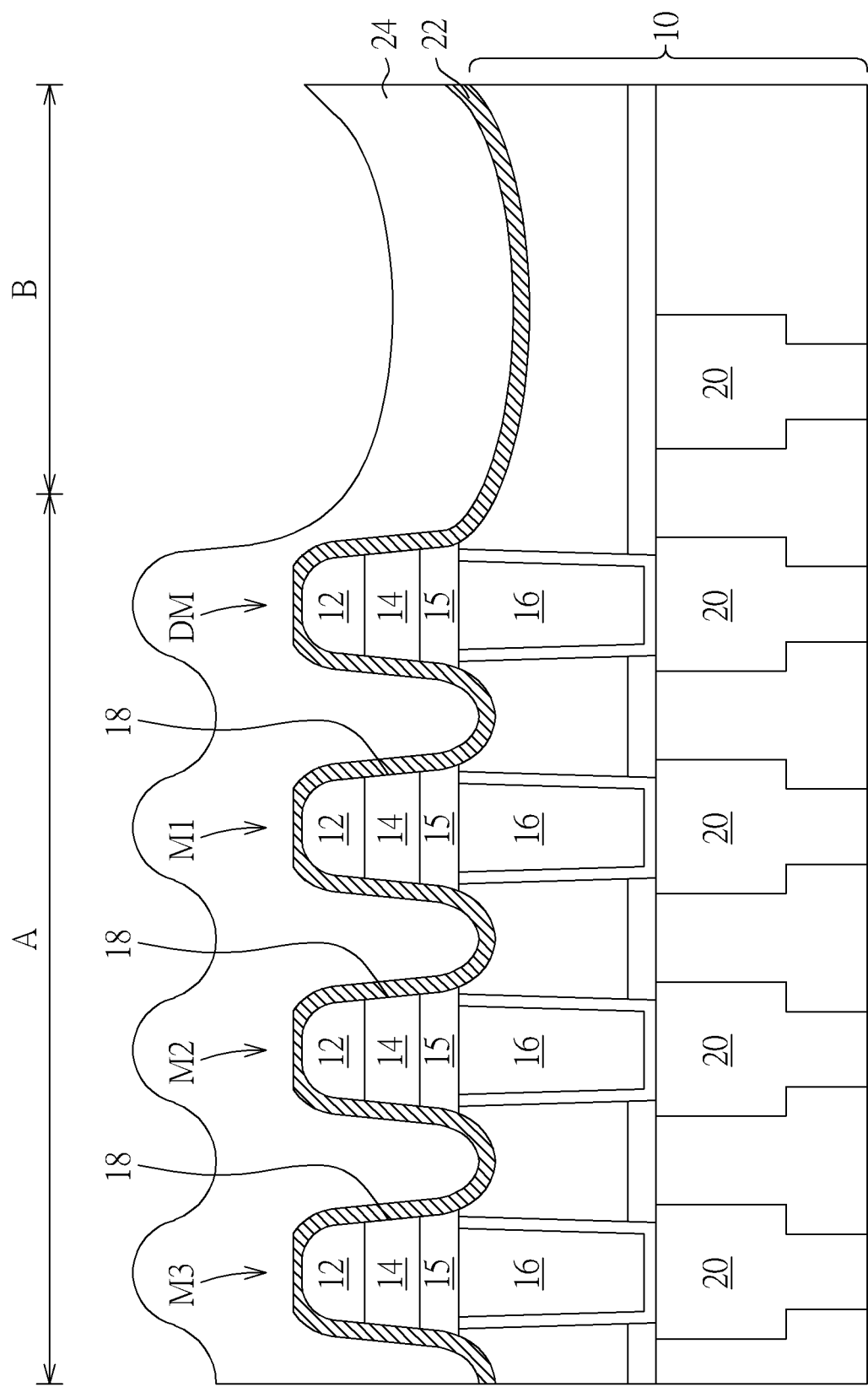
Figure 4:
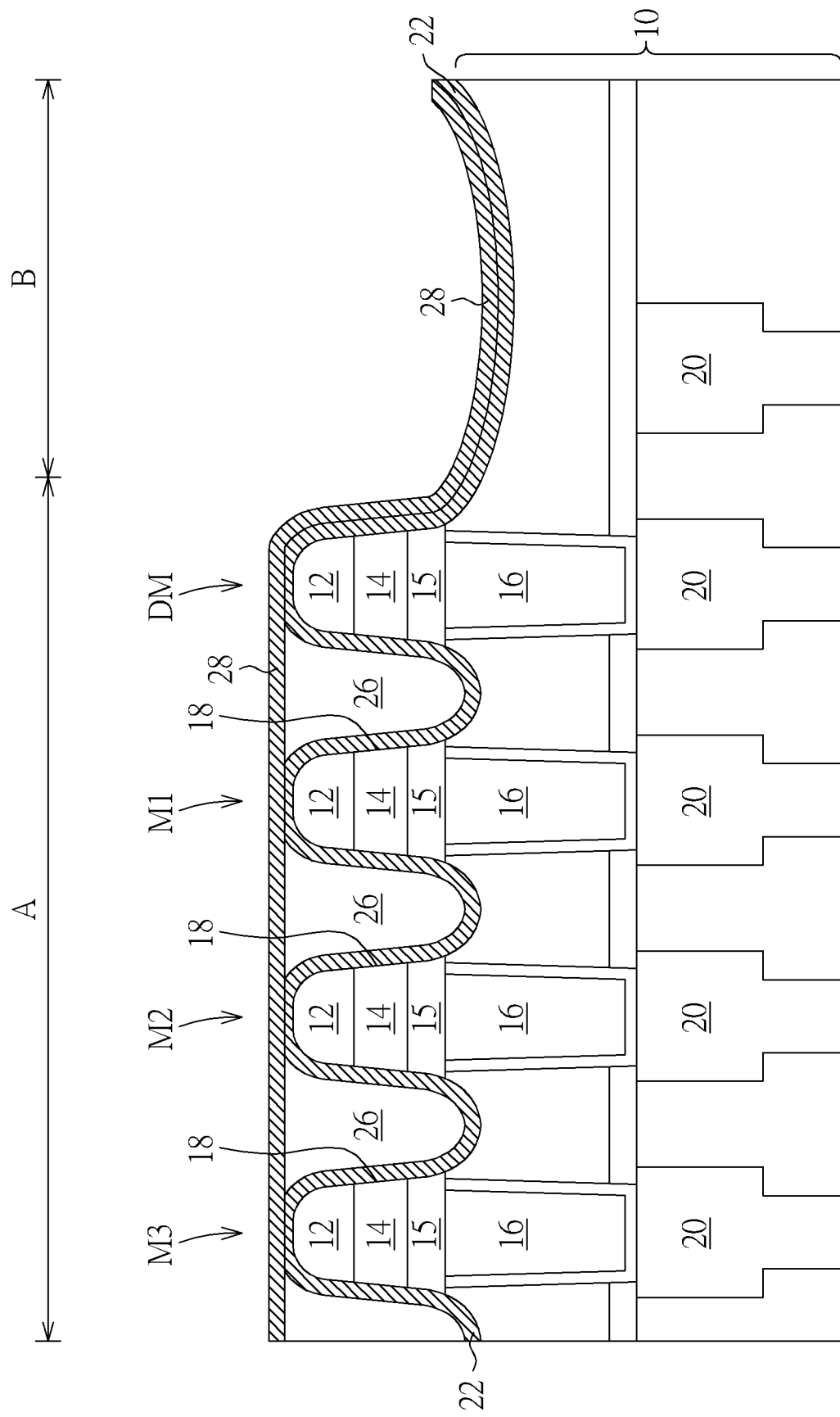

Therefore, a solution for preventing the deformation will be provided in the following description. The following steps will be presented in continuous of FIG. 2. As shown in FIG. 3, a tensile stress material layer 24 is formed to cover the first compressive stress layer 22 and fills in each of the gaps 18. The tensile stress material layer 24 includes silicon nitride, silicon oxide, silicon oxynitride or other insulating materials. According to a preferred embodiment of the present invention, the tensile stress material layer 24 is silicon oxide. As shown in FIG. 4, the tensile stress material layer 24 outside of the gaps 18 is removed. The tensile stress material layer 24 remains in each of the gaps 18 becomes a tensile stress piece 26. There are three tensile stress pieces 26 shown in this embodiment as an example. The tensile stress pieces 26 and the tensile stress material layer 24 are made of the same material. Moreover, an absolute value of a tensile stress in each of the tensile stress pieces 26 is the same as an absolute value of a tensile stress in the first compressive stress layer 22. In other way, a difference between the absolute value of the tensile stress in each of the tensile stress pieces 26 and the absolute value of the tensile stress in the first compressive stress layer 24 is smaller than a predetermined ratio. The predetermined ratio relates to deformation resistances of metal films in the MTJ 14. The tensile stress in the tensile stress pieces 26 can decrease or neutralize the compressive stress applying to the sidewall of the MTJ 14 by the first compressive stress layer 22, and prevents the metal films from deformation.

Please still refer to FIG. 4, a second compressive stress layer 28 is formed to cover the opening of each of the gaps 18, contact each of the tensile stress pieces 26 and cover the first MTJ M1, the second MRAM M2, the third MRAM M3, the dummy MRAM DM and the first compressive stress layer 22 at the peripheral circuit region B. Similar to the first compressive stress layer 22, the second compressive stress layer 28 contains a compressive stress; therefore moisture or oxygen can be blocked by the second compressive stress layer 28. In this way, the moisture or oxygen can be prevented from entering the tensile stress pieces 26. Because if the tensile stress pieces 26 absorb moisture and oxygen, the tensile stress in the tensile stress pieces 26 decreases and even transform into a compressive stress. Therefore, it is essential to protect the tensile stress pieces 26 by the second compressive stress layer 28. Furthermore, the thickness of the second compressive stress layer 28 is smaller than the thickness of the first compressive stress layer 22. According to a preferred embodiment of the present invention, the thickness of the second compressive stress layer 28 is about 10 angstroms.

Figure 5:
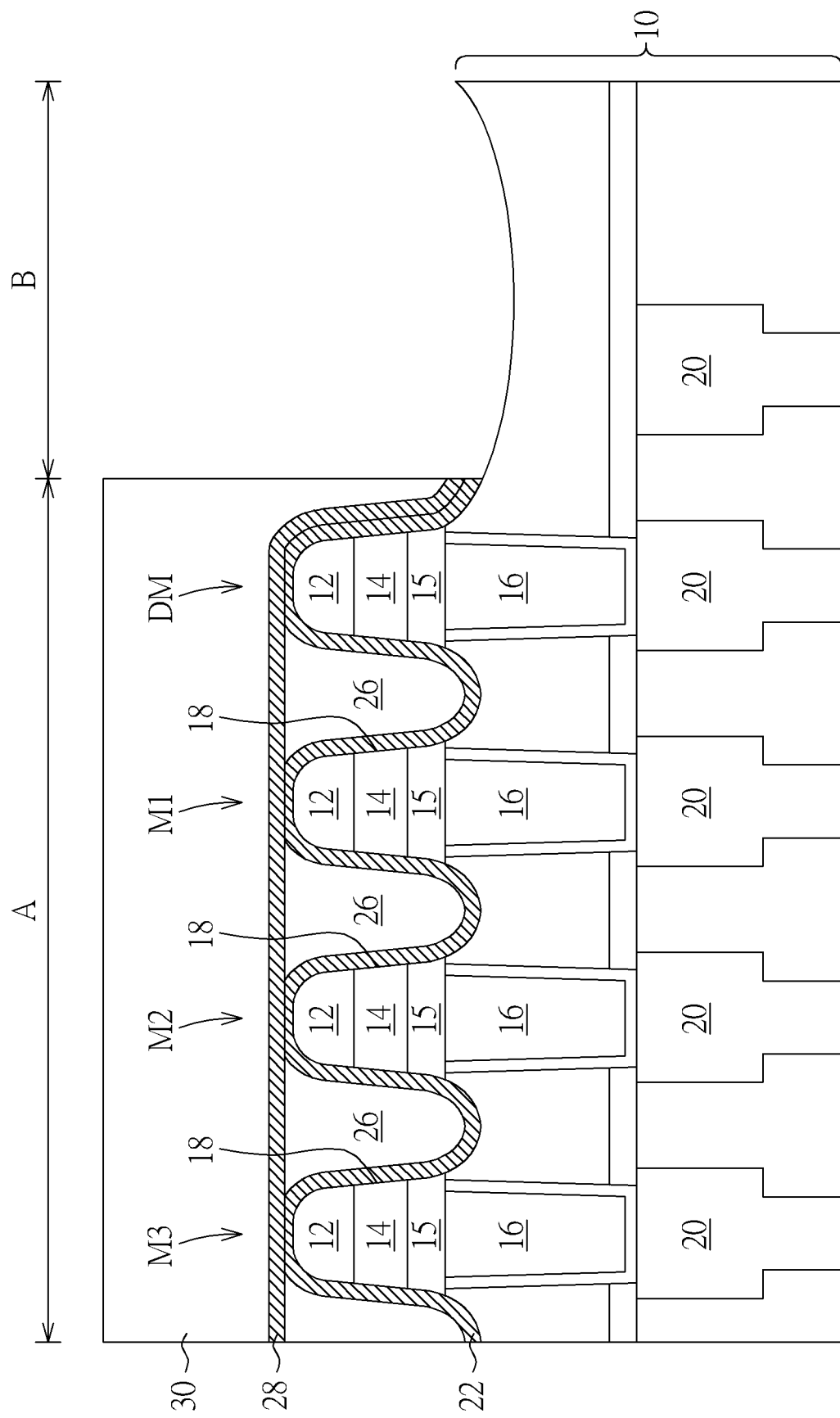

As shown in FIG. 5, a photoresist 30 is formed to cover the memory cell region A. Then, an etching process is performed to remove the first compressive stress layer 22 and the second compressive stress layer 28 within the peripheral circuit region B. Based on different requirements, the steps of removing the first compressive stress layer 22 and the second compressive stress layer 28 within the peripheral circuit region B can be omitted. That is, the first compressive stress layer 22 and the second compressive stress layer 28 within the peripheral circuit region B are remained. The following description is presented by removing the first compressive stress layer 22 and the second compressive stress layer 28 within the peripheral circuit region B as an example.

Figure 6:
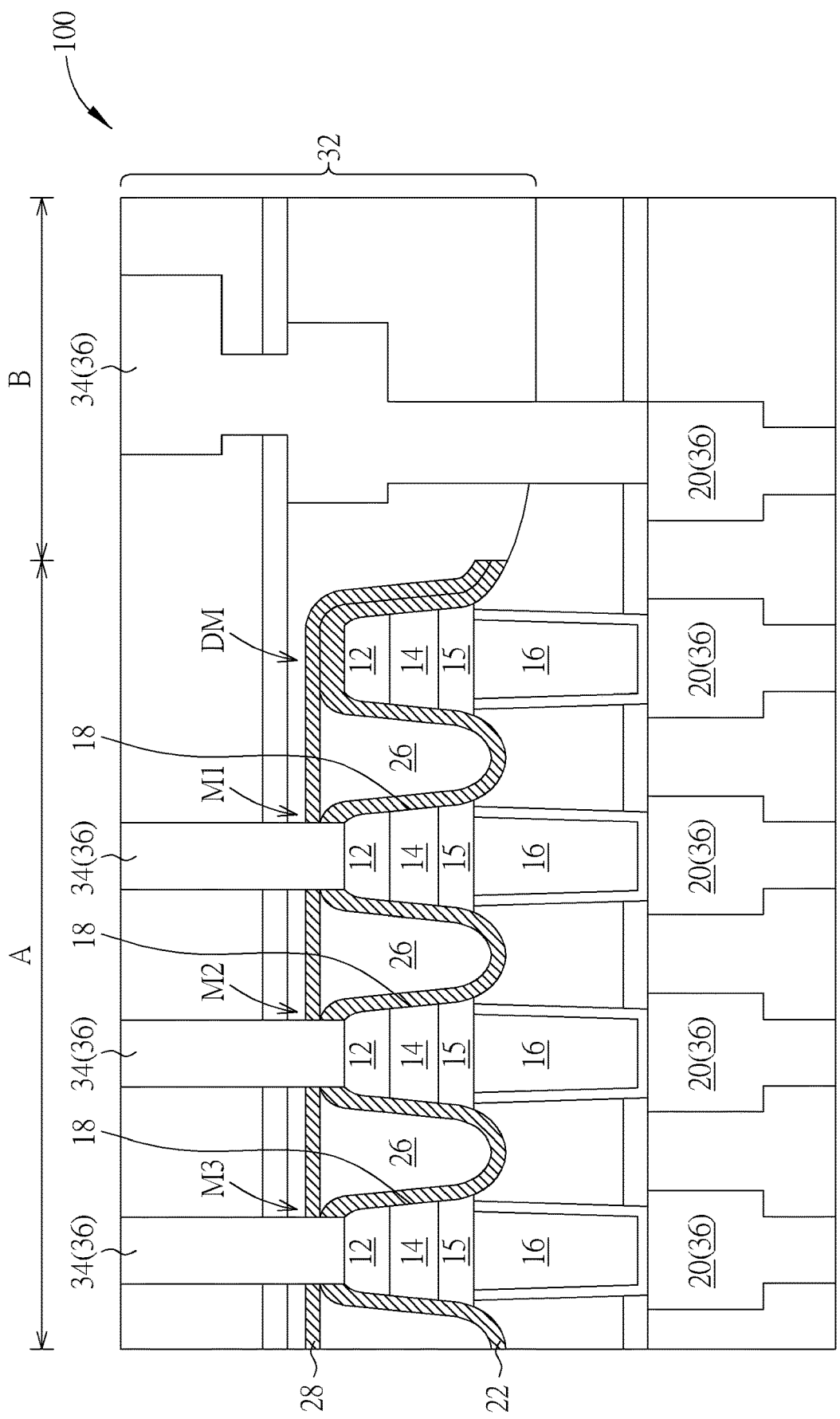

As shown in FIG. 6, the photoresist 30 is removed. Then, an interlayer dielectric 32 is formed to cover the memory cell region A and the peripheral circuit region B. Later, numerous metal interconnections 34 are formed to penetrate the interlayer dielectric 32. The metal interconnections 34 respectively contact the top electrode 12 of the first MRAM M1, the top electrode 12 of the second MRAM M2 and the top electrode 12 of the third MRAM M3. Moreover, the metal interconnections 34 are also formed within the peripheral circuit region B. It is noteworthy that there is no tensile stress piece 26 disposed at one side of the dummy MRAM DM. Therefore, one sidewall of the dummy MRAM DM sustained a compressive stress, but other sidewall of the dummy MRAM DM does not have any stress. Under this circumstance, the stress in two sides of the dummy MRAM DM is not match. This leads to unstable performance of the dummy MRAM DM. To solve this problem, the dummy MRAM DM is disabled on purpose to prevent the dummy MRAM DM to influence the efficiency of the MRAM structure. Therefore, in this embodiment, the dummy MRAM DM is disabled by not disposing any metal interconnections 34 on the top electrode 14 of the dummy MRAM DM. According to another preferred embodiment of the present invention, the dummy MRAM DM is disabled by not disposing any metal interconnections 34 below the bottom electrode 15 of the dummy MRAM DM.

As shown in FIG. 6, a MRAM structure includes a dielectric layer 10. numerous MRAMs are arranged in an array. For example, a first MRAM M1, a second MRAM M2 and a third MRAM M3 are disposed on the dielectric layer 10 from right to left in a row. The second MRAM M2 is disposed between the first MRAM M1 and the third MRAM M3. Moreover, the first MRAM M1 is disposed at the end of the row. Therefore, the first MRAM M1 is defined as an end MRAM in the row. Moreover, a dummy MRAM DM is disposed on the dielectric layer 10 and at one side of the first MRAM M1. Furthermore, the first MRAM M1, the second MRAM M2, the third MRAM M3 and the dummy MRAM DM are respectively formed of a top electrode 12, an MTJ 14 and a bottom electrode 15. Numerous gaps 18 are respectively disposed between the dummy MRAM DM and the first MRAM M1, the first MRAM M1 and the second MRAM M2, the second MRAM M2 and the third MRAM M3.

Moreover, numerous metal interconnecting structures 36 respectively electrically connect to each of the MRAMs. In details, the metal interconnecting structures 36 includes metal interconnections 20 and metal interconnections 34. The metal interconnections 20 are disposed within the dielectric layer 10. The metal interconnections 20 respectively contact and electrically connect the bottom electrode 15 of the first MRAM M1, the bottom electrode 15 of the second MRAM M2, the bottom electrode 15 of the third MRAM M3 and the bottom electrode 15 of the dummy MRAM DM through a bottom conductive line 16.

Numerous metal interconnections 34 respectively contact the top electrode 12 of the first MRAM M1, the top electrode 12 of the second MRAM M2 and the top electrode 12 of the third MRAM M3. It is noteworthy that there is no metal interconnection 34 on the top electrode 12 of the dummy MRAM DM.

As shown in FIG. 8, a first compressive stress layer 22 surrounds the entire sidewall and the top surface of the first MRAM M1, the entire sidewall and the top surface of the second MRAM M2, the entire sidewall and the top surface of the third MRAM M3, and the entire sidewall and the top surface of the dummy MRAM DM. At this point, the top surface of the first MRAM M1 is not covered by the first compressive stress layer 22. Similarly, the top surface of the second MRAM M2 and the top surface of the third MRAM M3 are also not covered by the first compressive stress layer 22. Furthermore, the bottom of the gaps 18 can be not covered by the first compressive stress layer 22 as well.

According to another preferred embodiment, as shown in FIG. 7, the first compressive stress layer 22 not only surrounds the entire sidewall of the MTJ 14, but also covers the bottom of the gaps 18.

Please refer to FIG. 6 again, according to yet another preferred embodiment of the present invention, besides covering the entire sidewall of the MTJ 14 and the bottom electrode of the gaps 18 shown in FIG. 7, as shown in FIG. 6, the first compressive stress layer 22 can also cover the top surface of the first MRAM M1, the top surface of the second MRAM M2, the top surface of the first MRAM M3 and the top surface of the dummy MRAM DM.

Please still refer to FIG. 6, numerous tensile stress pieces 26 respectively disposed in each of the gaps 18. The tensile stress in tensile stress pieces 26 can decreases or neutralizes the compressive stress applying to the sidewall of the MTJ 14 by the first compressive stress layer 22, and prevents the sidewall of the MTJ 14 from deformation. The first compressive stress layer 22 covers the bottom of the tensile stress pieces 26. An absolute value of a tensile stress in each of the tensile stress pieces 26 may be the same as an absolute value of a tensile stress in the first compressive stress layer 22. In other way, a difference between the absolute value of the tensile stress in each of the tensile stress pieces 26 and the absolute value of the tensile stress in the first compressive stress layer 24 is smaller than a predetermined ratio. The predetermined ratio relates to deformation resistances of metal films in the MTJ 14. For example, if the stress of the first compressive stress layer 22 is −100 MPa, the stress in each of the tensile stress pieces 26 can be between 70 and 130 Mpa, which means the difference between the absolute value of the tensile stress in each of the tensile stress pieces 26 and the absolute value of the tensile stress in the first compressive stress layer 24 is smaller than 30%. Base on the deformation resistances of metal films in the MTJ 14, the top electrode 12 and the bottom electrode 15, the difference can be between 0% and 50%. According to a preferred embodiment of the present invention, while the stresses in the first compressive stress layer 22 and in the tensile stress pieces 26 neutralize each other, there is no stress on the sidewall of the MTJ 14.

A second compressive stress layer 28 covers the opening of each of the gaps 18 and contacts each tensile stress piece 26. The thickness of the second compressive stress layer 28 is preferably not greater than the thickness of the first compressive stress layer 22. A thickness of the first compressive stress layer 22 is preferably not smaller than 50 angstroms. A thickness of the second compressive stress layer 28 is preferably about 10 angstroms. The first compressive stress layer 22, the second compressive stress layer 28 and the tensile stress pieces 26 can include silicon nitride, silicon oxide, silicon oxynitride or other insulating materials. According to a preferred embodiment of the present invention, the tensile stress pieces 26 are formed by silicon oxide. The first compressive stress layer 22 and the second compressive stress layer 28 are both formed by silicon nitride.

Figure 9:
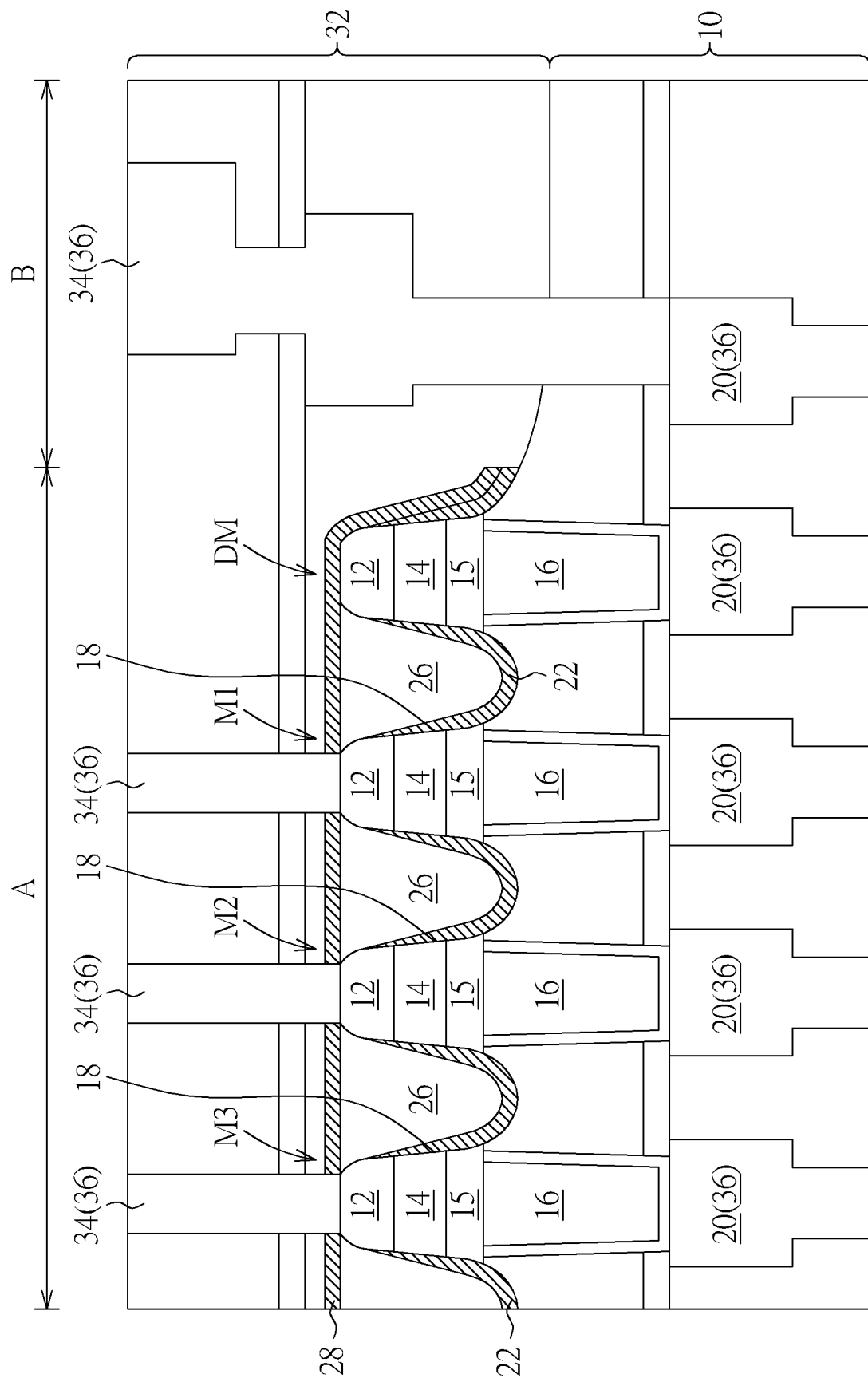
FIG. 9 depicts an MRAM structure according to another preferred embodiment of the present invention.

Please refer to FIG. 9. FIG. 9 depicts an MRAM structure according to another preferred embodiment of the present invention, wherein elements which are substantially the same as those in the embodiment of FIG. 6 are denoted by the same reference numerals; an accompanying explanation is therefore omitted. The difference between the MRAM structures in FIG. 9 and in FIG. 6 is that the first compressive stress layer 22 in FIG. 9 does not cover the top surface of the first MRAM M1, the top surface of the second MRAM M2, the top surface of the third MRAM M3 and the top surface of the dummy MRAM DM. Other elements have the same positions and materials.

Figure 10:
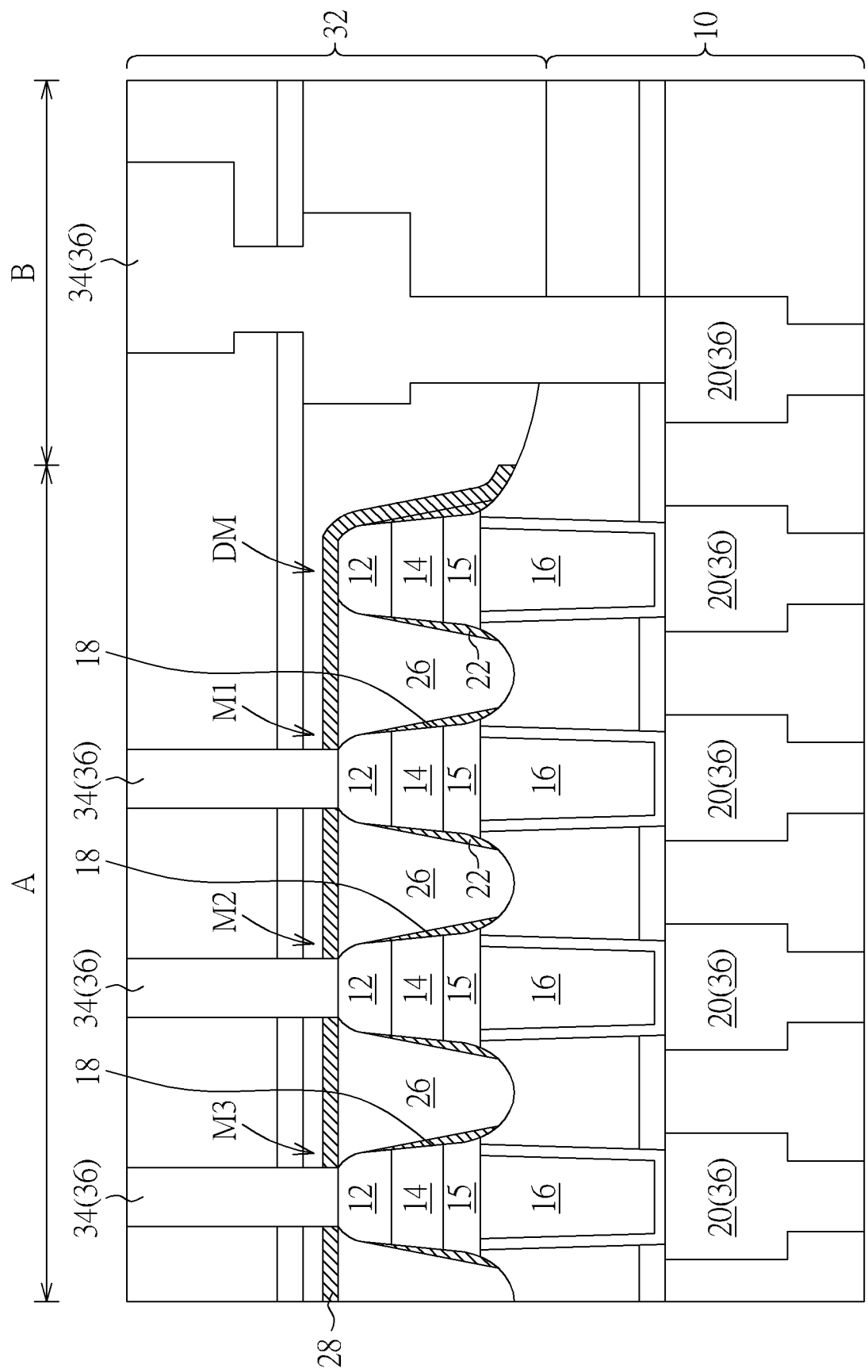
FIG. 10 depicts an MRAM structure according to yet another preferred embodiment of the present invention.

Please refer to FIG. 10. FIG. 10 depicts an MRAM structure according to yet another preferred embodiment of the present invention, wherein elements which are substantially the same as those in the embodiment of FIG. 6 are denoted by the same reference numerals; an accompanying explanation is therefore omitted. The difference between the MRAM structures in FIG. 10 and in FIG. 6 is that the first compressive stress layer 22 in FIG. 10 only surrounds the entire sidewall of the MTJ 14. Other elements have the same positions and materials.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetic random access memory (MRAM) structure, comprising:
    a dielectric layer;
    a first MRAM, a second MRAM and a third MRAM disposed on the dielectric layer, wherein the second MRAM is disposed between the first MRAM and the third MRAM, and the second MRAM comprises a magnetic tunneling junction (MTJ);
    two gaps respectively disposed between the first MRAM and the second MRAM and between the second MRAM and the third MRAM;
    two tensile stress pieces respectively disposed in each of the two gaps;
    a first compressive stress layer surrounding and contacting the sidewall of the MTJ entirely, wherein the first compressive stress layer contains compressive stress; and
    a second compressive stress layer covering the openings of each of the gaps and contacting the two tensile stress pieces, wherein the second compressive stress layer contains compressive stress, and an absolute value of a tensile stress in each of the two tensile stress pieces is the same as an absolute value of a tensile stress in the first compressive stress layer or a difference between the absolute value of the tensile stress in each of the two tensile stress pieces and the absolute value of the tensile stress in the first compressive stress layer is smaller than a predetermined ratio.

2. The MRAM structure of claim 1, wherein the first compressive stress layer covers a sidewall of the first MRAM entirely, a sidewall of the second MRAM entirely and a sidewall of the third MRAM entirely.

3. The MRAM structure of claim 1, wherein the first compressive stress layer covers a top surface of the first MRAM, a top surface of the second MRAM and a top surface of a third MRAM.

4. The MRAM structure of claim 1, wherein there is no compressive stress in a sidewall of the MTJ.

5. The MRAM structure of claim 1, wherein the two tensile stress pieces comprise silicon oxide, the first compressive stress layer comprises silicon nitride, and the second compressive stress layer comprises silicon nitride.

6. The MRAM structure of claim 1, wherein the first compressive stress layer covers a bottom of each of the two tensile stress pieces.

7. The MRAM structure of claim 1, wherein a thickness of the second compressive stress layer is not greater than a thickness of the first compressive stress layer.

8. The MRAM structure of claim 1, wherein a thickness of the first compressive stress layer is not smaller than 50 angstroms.

9. A magnetic random access memory (MRAM) structure, comprising:
    a dielectric layer;
    a plurality of MRAMs disposed on the dielectric layer and the plurality of MRAMs arranged in one row, wherein the plurality of MRAMs comprise an end MRAM disposed at an end of the row;
    a dummy MRAM disposed on the dielectric layer and at one side of the end MRAM;
    a gap disposed between the end MRAM and the dummy MRAM;
    a first compressive stress layer contacting a sidewall of the gap, wherein the first compressive stress layer contains compressive stress;
    a tensile stress piece disposed within the gap, wherein the dummy MRAM comprises a first sidewall and a second sidewall, and the first sidewall is opposed to the second sidewall, the gap is disposed between the end MRAM and the first sidewall of the dummy MRAM, and there is no tensile stress piece disposed at the second sidewall of the dummy MRAM;
    a second compressive stress layer covering an opening of the gap and contacting the tensile stress piece, wherein the second compressive stress layer contains compressive stress; and
    a plurality of metal interconnections respectively contacting each of the plurality of MRAMs.

10. The MRAM structure of claim 9, wherein each of the plurality of the metal interconnections comprises a first metal interconnection and a second metal interconnection respectively electrically connecting to a top electrode and a bottom electrode of each of the plurality of MRAMs, and the dummy MRAM only electrically connects to one of the first metal interconnection and the second metal interconnection.

11. The MRAM structure of claim 9, wherein the tensile stress piece comprises silicon oxide, the first compressive stress layer comprises silicon nitride, and the second compressive stress layer comprises silicon nitride.

12. The MRAM structure of claim 9, wherein an absolute value of a tensile stress in the tensile stress piece is the same as an absolute value of a tensile stress in the first compressive stress layer or a difference between the absolute value of the tensile stress in the tensile stress piece and the absolute value of the tensile stress in the first compressive stress layer is smaller than a predetermined ratio.

13. The MRAM structure of claim 9, wherein the first compressive stress layer covers a sidewall of the end MRAM entirely and a sidewall of the dummy MRAM entirely.

14. The MRAM structure of claim 9, wherein the first compressive stress layer covers a top surface of the end MRAM and a top surface of the dummy MRAM.

15. The MRAM structure of claim 9, wherein the end MRAM comprises a magnetic tunneling junction (MTJ), and there is no compressive stress in a sidewall of the MTJ.

16. The MRAM structure of claim 9, wherein the first compressive stress layer covers a bottom of the tensile stress piece.

17. The MRAM structure of claim 9, wherein a thickness of the second compressive stress layer is not greater than a thickness of the first compressive stress layer.

18. The MRAM structure of claim 9, wherein a thickness of the first compressive stress layer is not smaller than 50 angstroms.

* * * * *